United States Patent [19]

Zajac

[11] Patent Number: 4,539,062

[45] Date of Patent: Sep. 3, 1985

[54] MODULAR PLASMA REACTOR WITH LOCAL ATMOSPHERE

[75] Inventor: John P. Zajac, San Jose, Calif.

[73] Assignee: Tegal Corporation, Novato, Calif.

[21] Appl. No.: 588,853

[22] Filed: Mar. 12, 1984

[51] Int. Cl.³ .................... H01L 21/306; C23F 1/00
[52] U.S. Cl. ............................. 156/345; 118/50;
118/715; 156/643; 156/646; 204/298
[58] Field of Search ............ 204/164, 192 EC, 192 E,
204/298; 156/345, 643, 646; 427/38, 39;
118/715, 733, 50.1, 620, 50

[56] References Cited

U.S. PATENT DOCUMENTS 4,209,357  6/1980  Gorin et al. .................. 156/345 X

*Primary Examiner*—William A. Powell
*Attorney, Agent, or Firm*—Paul F. Wille; Jonathan P. Meyer

[57] ABSTRACT

A plasma reactor system is described in which a plurality of components are segregated into modules. Devices known as mass flow controllers for gas supply lines are located one each per module. A plenum for inert gas is connected to each module to bath the module in an inert atmosphere.

4 Claims, 4 Drawing Figures

MODULAR PLASMA REACTOR WITH LOCAL ATMOSPHERE

BACKGROUND OF THE INVENTION

This invention relates to process equipment using reactive gases and, in particular, to plasma reactors using various gases.

In the past, the delivery of gases to a plasma reactor comprised a series of relatively permanent connections through various piping, valves, and blocks. Changes or adjustments are typically difficult due to the permanence of the connections as well as their physical location in the equipment. This often results in gas handling portions being difficult to adjust or repair after the equipment is installed.

Plasma reactors use a variety of gases to effect etch or deposition of material on a semiconductor wafer. Some of the gases used may be toxic, corrosive, or both. Thus, care must be exercised when adjusting or repairing the reactor. In addition, disassembling the plumbing connections can introduce leaks, moisture and other contaminants which negatively effect the operation and life expectancy of the gas system.

The nature of the gases produce another difficulty, viz. the need to purge the system after each system shutdown or period of disuse. Particularly troublesome is the contamination of the reactor chamber. Aside from the volume of the chamber, the internal shape typically presents pockets in which a contaminating gas, eg. atmosphere, can reside despite repeated purging. It is thus highly desirable for one to isolate portions of the gas handling system so that the entire system need not be purged and/or exposed to air.

The manufacture of semiconductor devices using a plasma is characterized by a continued striving for and improvement in the control of the process. One item which has greatly assisted in this endeavor is what is known as a mass flow controller. In these devices, the mass of the gas flowing to the reactor chamber is metered rather than the volume. A typical reactor may have several of these devices located throughout the apparatus. Unfortunately, mass flow controllers are not noted for reliability. Thus, there are frequent periods when the apparatus is inoperative during adjustment or replacement of the mass flow controller.

Even when running properly, small leaks in the gas system may cause problems if the gas is corrosive. Electrical connectors and wiring can deteriorate rapidly in a corrosive atmosphere. One approach to cure this problem is to securely isolate the electronics from the gas, eg. with appropriate sleeves, boots, potting compound or the like. This makes it very difficult to repair or adjust the electronics in the system.

In view of the foregoing, it is therefore an object of the present invention to improve gas control reliability in wafer processing equipment.

Another object of the present invention is to provide means for isolating gas lines in plasma reactor apparatus.

A further object of the present invention is to provide means for enabling equipment using reactive gases to be modularly constructed.

Another object of the present invention is to provide plasma reactor apparatus having a local atmosphere.

SUMMARY

The foregoing objects are achieved in the present invention wherein a plurality of components are segregated into modules. A plenum is provided for supplying an inert gas or gas mixture to the modules. The inert gas flows into the module through various joints in the module container adjacent the plenum and out from the module through other joints, thereby bathing the module in an inert atmosphere. Mass flow controllers, in particular, for the plasma reactor are segregated, one each in a module. In so doing, the cost of repairs or maintenance is significantly reduced. In the case of a module containing a mass flow controller, a vacuum attachment creates a negative pressure in the module, thus drawing in outside air which dilutes and removes any corrosive gases which are leaked.

DESCRIPTION OF DRAWINGS

A more complete understanding of the present invention can be obtained by considering the following detailed description in conjunction with the accompanying drawings, in which.

DESCRIPTION OF THE PREFERRED EMBODIMENT

Figure 1:
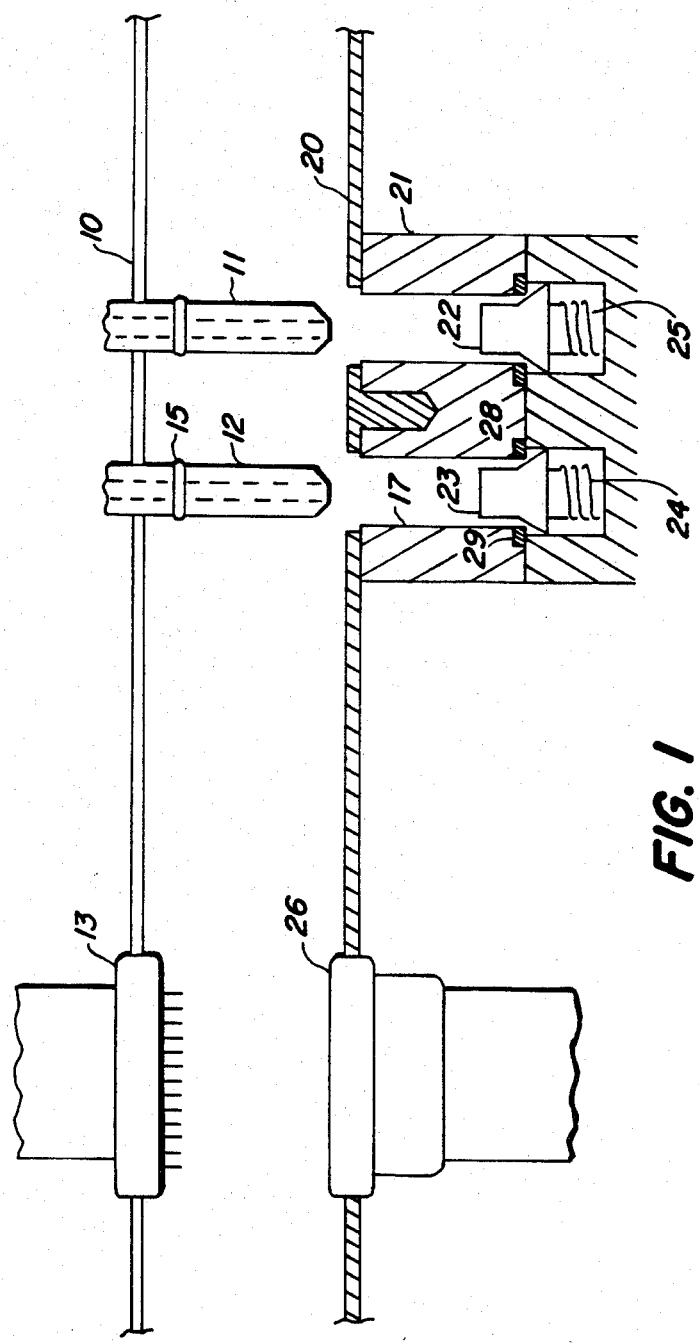
FIG. 1 illustrates a two valve shutoff mechanism in accordance with the present invention.

As illustrated in FIG. 1, two panels such as panels 10 and 20, each having fittings for gas lines and electrical connectors, can be readily connected and disconnected. Specificially, wall or panel 10 comprises gas lines 11 and 12 which pass therethrough and are connected to panel 10 by suitable means (not shown). Also passing through panel 10 is electrical connector 13, herein illustrated as a connector for flat ribbon cable. Panel 20 has block 21 connected thereto as well as electrical connector 26, each spaced corresponding to connector 13 and gas lines 11 and 12. Block 21 comprises first and second bores aligned specifically with gas lines 11 and 12. At the ends of the bores away from gas lines 11 and 12 are valves 22 and 23 respectively. Valves 22 and 23 comprise a conical portion which is urged against a seat in block 21 by springs 24 and 25 and is assisted by the pressure of the gas behind the valve. Valve members 22 and 23 comprise a plurality of bores, such as bore 28, which passed through valve 23 interior to the contact region between valve 23 and seat 29. One such bore is aligned with the axis of valve 23 and communicates between the end of valve 23 and bore 28, thereby providing a path for the gas to flow to and from gas line 12.

In operation, a device having panel 10 as one wall thereof is aligned with panel 20 and moved in close proximity thereto so that gas lines 11 and 12 and connector 13 mate with the respective bores in block 21 and with connector 26, respectively. As gas line 12 is inserted into bore 17, the end thereof engages valve 23 pushing valve 23 downward against spring 24. This moves valve 23 away from shoulder 29, thereby opening tbe valve. Before the valve is opened, resilient ring 15 engages bore 17, thereby sealing the bore. As panels 10 and 20 are moved together, connectors 13 and 26 are engaged as well, thereby completing both an electrical and mechanical connection between a module comprising 10 and a frame or other structural member comprising panel 20.

Figure 2:
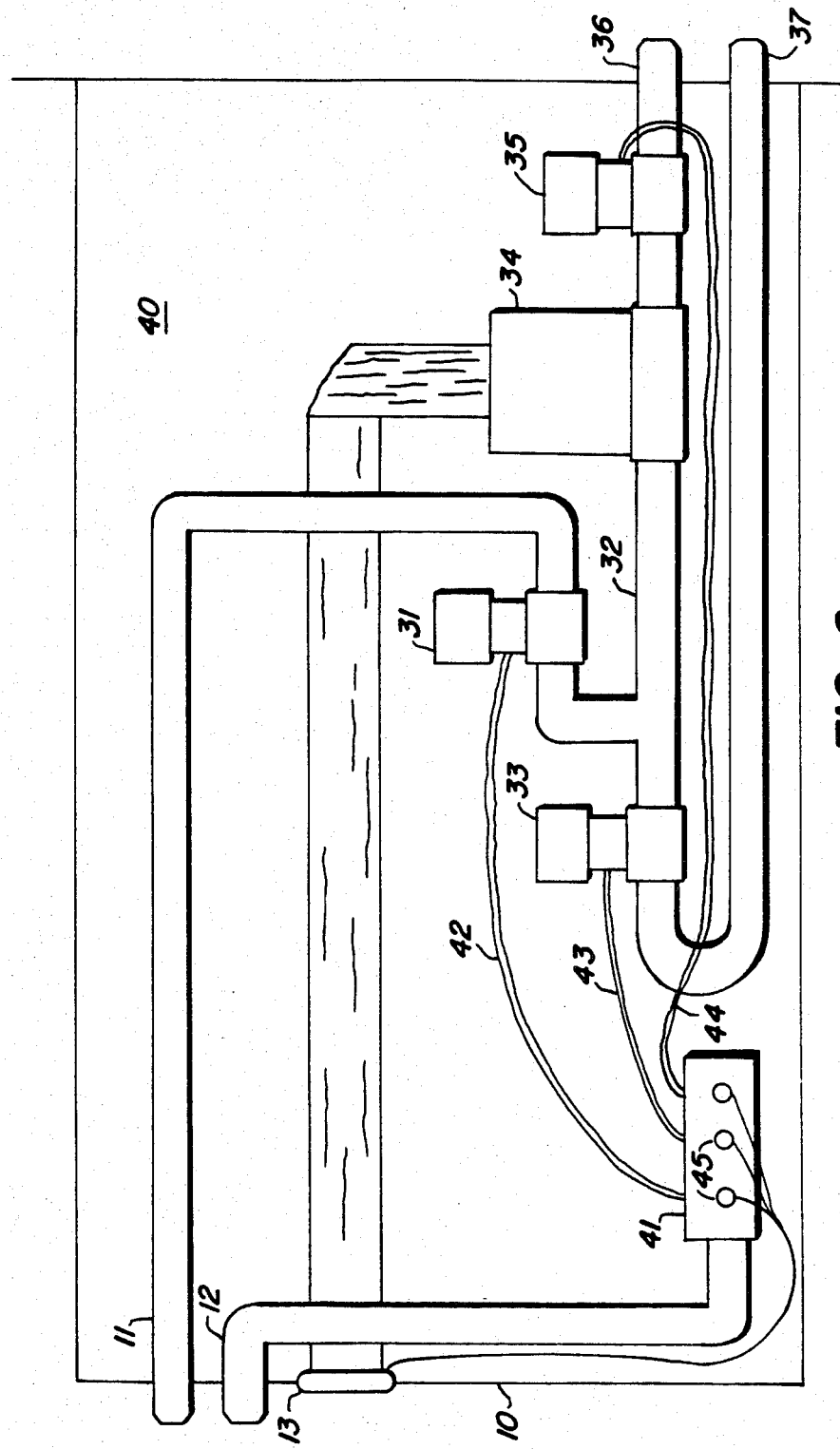
FIG. 2 illustrates a gas module incorporating the contained, modular design of the present invention.

FIG. 2 illustrates a modular gas assembly, specifically a mass flwo controller module. As previously noted, these devices are typically grouped together and placed where convenient during manufacture or assembly in plasma equipment of the prior art. As illustrated in FIG. 2, a single gas flow control system is incorported in a single module. If more than one such apparatus is needed or desired, a plurality of modules are then pralleled to provide the necessary capacity. Utilizing the shutoff valve illustrated in FIG. 1 enables one to support one or more modules without substantial reconstruction of panel 20. Module 40 comprises gas lines 11 and 12 and connector 13, corresponding to those elements in FIG. 1. Gas line 11 is connected to isolation valve 31. Valve 31, in turn, is connected to gas line 32, which interconnects valve 33 and mass flow controllr 34. Mass flow controller 34, commercially available per se, is connected by way of valve 35 to the front of module 40 by way of gas line 36. Valve 33 is also coupled to the front panel of module 40 by way of gas line 37. Valves 33 and 35 also comprise cut-off valves. Line 12 is connected to block 41 which provides distribution of a pneumatic gas, by way of lines 42-44 to valves 31, 33, and 35, respectively. Block 41 comprises a plurality of electrically controlled valves connected to connector 13 by way of terminals 45. Thus each of lines 42-44 is selectively controlled electrically from outside module 40.

In operation, the mass of gas flowing through mass flow controllr 34 is detected and an electricl signal representative thereof is coupled by way of connector 13 to a remote control apparatus. Suitable apparatus is well-known per se in the art and need not be detailed here. Depending upon the amount of gas flowing through line 36–37, a control signal is returned via connector 13 to controller 34, whereby the gas flow is regulated. Additional control is provided by block 41 which operates valves 31, 33, and 35 for purging or operating the module. Gas line 11 comprises an inert gas such as nitrogen for purging lines 36–37 by way of control of valve 31.

By this construction, module 40 is readily paralleled with other modules and is easily inserted into or removed from a system. Further, upon removal, the gas lines at the rear of the module are automatically sealed by way of the valves illustrated in FIG. 1. Typically, manual shutoff valves are placed close to where lines 36 and 37 emerge from the front panel of module 40. Thus, the remainder of the system can be isolated from module 40 to allow removal and replacement thereof. The automatic action of valves such as shown in FIG. 1 greatly facilitates this function. This arrangement greatly simplifies the maintenance of equipment using such modules and vastly decreases down time since a replacement module can be inserted immediately. Further, by providing a single mass flow controller per module, one simplifies the repair of the system because the faulty part is inherently isolated within its own module.

Figure 3A:
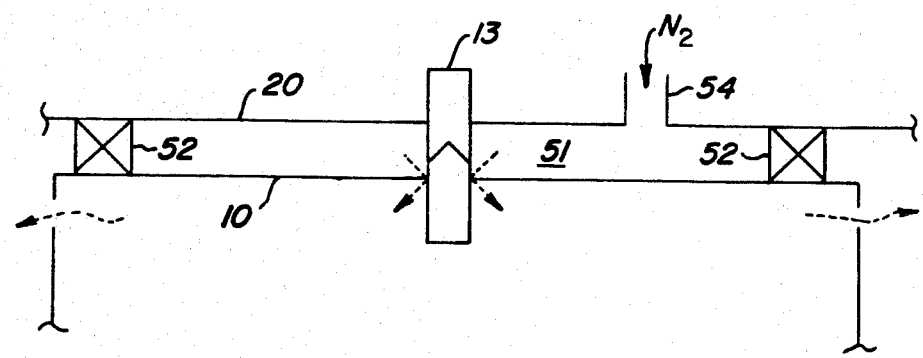
FIGS. 3A and 3B illustrate inert gas flow in the case of an electronic module and a mass flow controllr module, respectively.
Figure 3B:
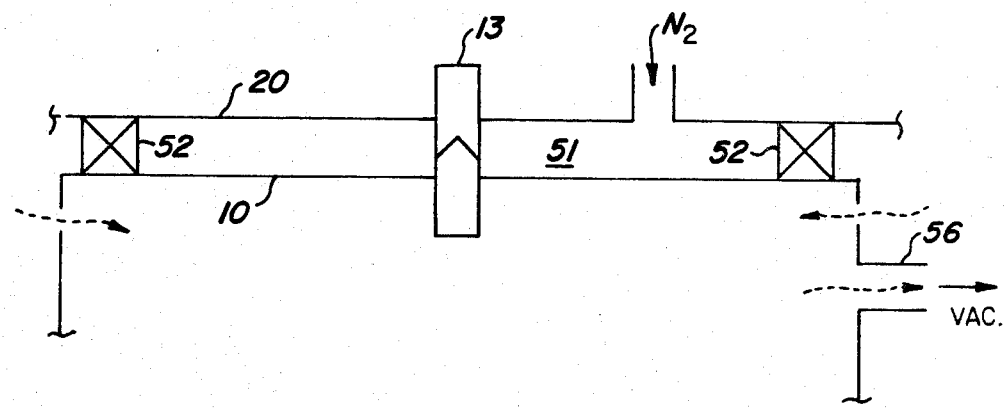

The corrosive nature of the gases used in plasma reactors presents two problems in designing a modular reactor apparatus. First, in modules containing purely electrical equipment, it is desirable to preclude the entry of gases from nearby plumbing. Second, in modules containing plumbing, such as a mass flow controller module, it is desirable to preclude the escape of leaked gases. FIGS. 3A and 3B illustrate solutions to these two problems, respectively.

FIG. 3A illustrates what amounts to a top view of a portion of the rear panel of an electronic module. An electronic module is substantially similar to a gas module as described above with reference to FIG. 2 with the exception of the gas plumbing features. For instance, a microprocessor controller, a junction box, or similar items may be housed in an electronic module. Specifically, panels 10 and 20 are as previously described while connector 13 is schematically illustrated as extending therebetween. FIG. 3A illustrates a further advantage of the modularly constructed apparatus in that a plenum 51 is provided behind panel 10 as defined between suitable sealing members 52 and 53. Seals 52 and 53 may comprise foam rubber strips and need not be extremely tight seals. A suitable fitting 54 is provided for supplying an inert gas, such as nitrogen, which fills plenum 51 and leaks into the module from plenum 51 around connector 13. The inert gas then leaks out of the module through apertures in the housing thereof. Thus, the electronics housed therein are exposed to a slight positive pressure of an inert gas, thus excluding the entry of corrosive leaked gas.

FIG. 3B illustrates a similar, but slightly different approach, to the problem of isolating leaks in gas modules. Panels 10 and 20, connector 13, seals 52, plenum 51 and fitting 54 are similar to those shown above. In this case, however, the interior of the module is kept at a slight negative pressure by means of a fitting 56 which is connected to a vacuum system. This draws outside air into the module through its apertures, thus diluting and exhausting any leaked gas. Further, the electronic connections behind panel 10 remain bathed in nitrogen to inhibit corrosion. In the event of a gas leak, the inert gas from plenum 51 flows around connector 13, thereby protecting the electrical connections therein. Similar protection is obtained at other locations in the system which are deliberately not tightly sealed.

In so doing, one obtains a system which may comprise a plurality of electrical connections which are reliable and remain reliable despite proximity to corrosive gases which may leak from other parts of the system. This further improves the cleanliness of the system by providing a controlled atmosphere locally, that is within the system itself.

Having thus described the invention it will be apparent to those of skill in the art that various modifications can be made within the spirit and scope of the present invention. For example, the plenum need not be formed with the sides of a module but can comprise a separate element. Further, depending upon application, the equipment itself need not contain the reduced pressure atmosphere; eg. a separate vent hood can be provided for the equipment. The pressure in the plenum must then be above atmospheric for the inert gas to flow out of the equipment. The illustration of a mass flow controller is understood to be but one application of the modular construction in accordance with the present invention. Further, the number and location of the various connections is understood to depend upon the particular application. It is, however, necessary that the plenum be located proximate the electrical connections to adequately protect the connections from corrosive fumes. The arrangement of FIG. 3 applies to any module one wishes to protect, not only gas modules.

I claim:

1. In equipment for processing semiconductor wafers with a plasma, said equipment including as components a reactor chamber, one or more gas supply lines associated with said chamber, an electronic control unit, and a plurality of transducers coupled to said control unit, the improvement comprising:

a plurality of modules for containing at least some of said components;

a plenum for containing an inert atmosphere; and said modules being coupled to said plenum so that said atmosphere flows through and around said module.

2. The equipment as set forth in claim 1 wherein said modules form one wall of said plenum.

3. The equipment as set forth in claim 1 or 2 wherein at least one of said modules comprises a mass flow controller.

4. The equipment as set forth in claim 3 wherein a plurality of said modules each comprise a single mass flow controller.

* * * * *